United States Patent
Lin et al.

(10) Patent No.: US 9,406,842 B2
(45) Date of Patent: Aug. 2, 2016

(54) FLIP CHIP LIGHT EMITTING DIODE PACKAGING STRUCTURE

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/686,152

(22) Filed: Apr. 14, 2015

(65) Prior Publication Data

US 2016/0064604 A1    Mar. 3, 2016

(30) Foreign Application Priority Data

Sep. 3, 2014    (CN) .......................... 2014 1 0445113

(51) Int. Cl.
*H01L 33/50*    (2010.01)
*H01L 33/20*    (2010.01)
*H01L 33/56*    (2010.01)
*H01L 33/62*    (2010.01)

(52) U.S. Cl.
CPC .............. *H01L 33/20* (2013.01); *H01L 33/502* (2013.01); *H01L 33/56* (2013.01); *H01L 33/62* (2013.01)

(58) Field of Classification Search
CPC ......... H01L 33/20; H01L 33/56; H01L 33/62; H01L 33/502
See application file for complete search history.

(56) References Cited

U.S. PATENT DOCUMENTS

| 6,573,537 B1* | 6/2003 | Steigerwald | ........ H01L 25/0753 257/103 |
| 7,358,539 B2* | 4/2008 | Venugopalan | .......... H01L 33/20 257/103 |
| 2013/0285093 A1 | 10/2013 | Lo | |

FOREIGN PATENT DOCUMENTS

| TW | 201044653 A1 | 12/2010 |
| TW | 201336121 A1 | 9/2013 |
| TW | 201344968 A1 | 11/2013 |

* cited by examiner

*Primary Examiner* — David Vu
(74) *Attorney, Agent, or Firm* — ScienBiziP, P.C.

(57) ABSTRACT

A flip chip light emitting diode (LED) packaging structure, including a substrate, an LED chip including a P electrode and a N electrode. A protruding platform is formed in a center of the substrate. The protruding platform includes a first connecting portion and a second connecting portion electrically insulating from each other. The P electrode and the N electrode is conductively fixed to the protruding platform by solder, and a bottom edge of the P electrode and the N electrode are beyond a top edge of the protruding platform.

15 Claims, 4 Drawing Sheets

FLIP CHIP LIGHT EMITTING DIODE PACKAGING STRUCTURE

CROSS-REFERENCE TO RELATED APPLICATIONS

This application claims priority to Chinese Patent Application No. 201410445113.2 filed on Sep. 3, 2014, the contents of which are incorporated by reference herein.

FIELD

The subject matter herein generally relates to a light emitting diode packaging structure, specifically to a flip chip light emitting diode packaging structure.

BACKGROUND

A generally flip chip light emitting diode includes an N type semiconductor layer, a light active layer and a P type semiconductor layer arranged in order. An N electrode is mounted on the N type semiconductor layer, and a P electrode is mounted on the P type semiconductor layer. While the flip chip light emitting diode is encapsulated, the flip light emitting diode is mounted on a substrate, the N electrode and the P electrode are coupled with electrodes of the substrate by sealing. However, the solder is prone to move away the P electrode and the N electrode to cover the substrate, or couple with the P electrode and the N electrode to make a short circuit. The solder moving away the P electrode and the N electrode also absorbs light generated from the light active layer to influence the light output efficiency of the flip light emitting diode.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
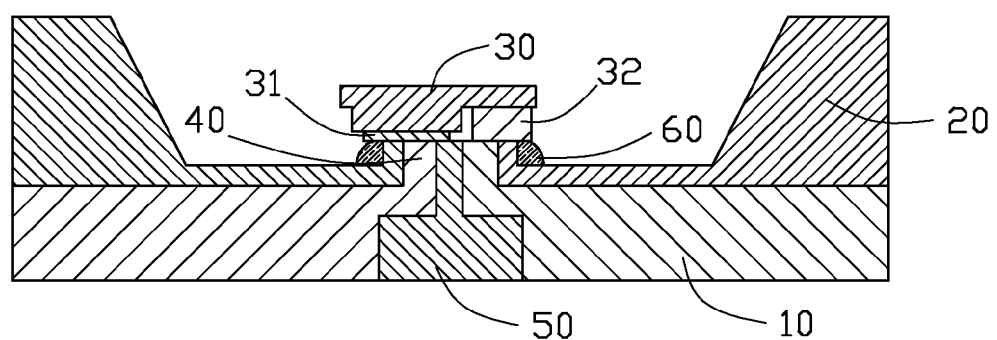
FIG. 1 is a cross sectional view of a flip chip light emitting diode packaging structure of a first embodiment of the present disclosure.

Referring to FIG. 1, a flip chip light emitting diode (LED) packaging structure of a first embodiment includes a substrate 10, a reflecting cup 20 located on the substrate 10, and an LED chip 30 received in a bottom of the reflecting cup 20.

The substrate 10 is a elongated plate and is made of electrical conductive material. The substrate 10 has a first side and a second opposite the first side. A protruding platform 40 is formed on the first side of the substrate 10. A cross section of the protruding platform 40 is rectangular. The protruding platform 40 has a top surface with a first edge and a second edge opposite the first edge.

Figure 2:
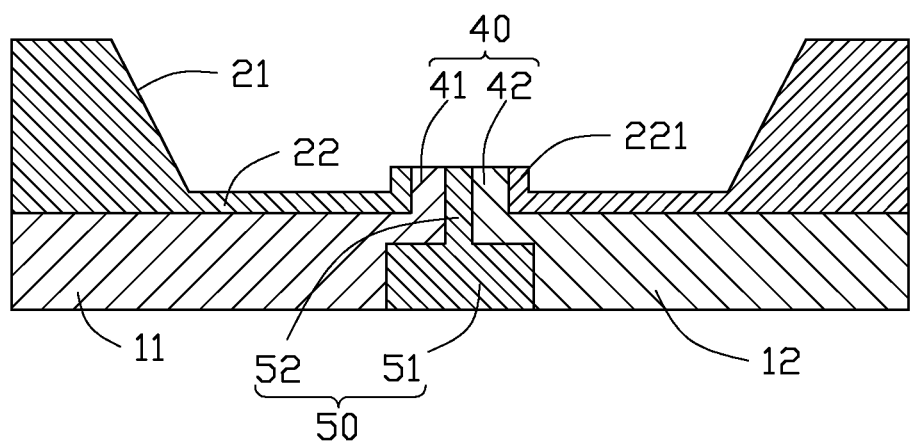
FIG. 2 is a cross sectional view of a substrate of the flip chip light emitting diode packaging structure of FIG. 1.

Referring to FIG. 2, the reflecting cup 20 is made of reflecting material. The reflecting cup 20 includes an inner surface 21 and a bottom surface 22. The inner surface 21 and the bottom surface 22 cooperatively define a receiving chamber therebetween to receive the LED chip 30 therein. A protruding ring 221 is formed on a central portion of the bottom surface 22 to surround the protruding platform 40 therein. A top surface of the protruding platform 40 is coplanar with a top surface of the protruding ring 221. A periphery of the reflecting cup 20 and a periphery of the substrate 10 are coplanar.

The LED chip 30 is fixed on the top surface of the protruding platform 40. The LED chip 30 includes a P electrode 31 and an N electrode 32. The LED chip 30 is mounted on the top surface of the protruding platform 40 by a solder 60. A sum of an area of the top surface of the protruding platform 40 is smaller than that of an area of the bottom surface of the P electrode 31 and the N electrode 32.

Further, an insulation portion 50 extends through the substrate 10. The insulation portion 50 is made of electrically insulating material. The insulation portion 50 extends from a bottom end of the substrate 10 to a top end of the protruding platform 40. The insulation portion 50 includes a main portion 51 and an extending portion 52 extending from a top end of the main portion 51 to the top end of the protruding platform 40. A width of the main portion 51 is more than that of the extending portion 52. A top surface of the extending portion 52 is coplanar with the top surface of the protruding platform 40. The insulation portion 50 divides the substrate 10 to be a first substrate 11 and a second substrate 12. In the same way, the insulation portion 50 also divides the protruding platform 40 to be a first connecting portion 41 and a second connecting portion 42 electrically insulating from each other. The first connecting portion 41 couples with the first substrate 11 to collectively form a first electrode; the second connecting portion 42 couples with the second substrate 12 to collectively form a second electrode. The first connecting portion 41 along the first edge, and the second connecting portion 42 along the second edge. A top surface of the first connecting potion 41 and the second connecting portion 42 is to couple with the P electrode 31 and the N electrode 32. The P electrode 31 rests on a portion of the top protruding platform surface with a portion of the P electrode 31 extending away from the first top surface edge and the P electrode 31 is electrically connected to the first connection portion 41; and the N electrode 32 rests on a portion of the top protruding platform surface with a portion of the N electrode 32 extending away from the second top surface edge and the N electrode 32 is electrically connected to the second connection portion 42.

While the LED chip 30 is fixing to the protruding platform 40, the P electrode 31 and the N electrode 32 of the LED chip 30 are conductively fixed on the top surface of the first connecting portion 41 and the second connecting portion 42 by the solder 60. Because the sum of the area of the top surface of the protruding platform 40 is smaller than that of the area of the bottom surface of the P electrode 31 and the N electrode 32, so a bottom edge of the P electrode 31 and the N electrode 32 are beyond a top edge of the protruding platform 40. In this embodiment, the protruding ring 221 is so thin that the bottom edge of the P electrode 31 and the N electrode 32 are also beyond the top edge of the protruding ring 221. So while the LED chip 30 is fixing to the protruding platform 40 by the solder 60 filling between the top surface of the protruding platform 40 and the bottom surface of the P electrode 31 and the N electrode 32. The solder 60 overflowing the protruding platform 40 moves along edges of the protruding platform 40 under gravity and receives between the bottom surface of the P electrode 31 and the N electrode 32 and the edges of the protruding platform 40. So the solder 60 overflowing the protruding platform 40 is limited to lead to a short circuit between the P electrode 31 and the N electrode 32. The solder 60 is also prevented from moving to surround the P electrode 31 and the N electrode 32 to absorb the light generated from the LED chip 30, so a luminous efficiency of the LED chip 30 can be improved.

Figure 3:
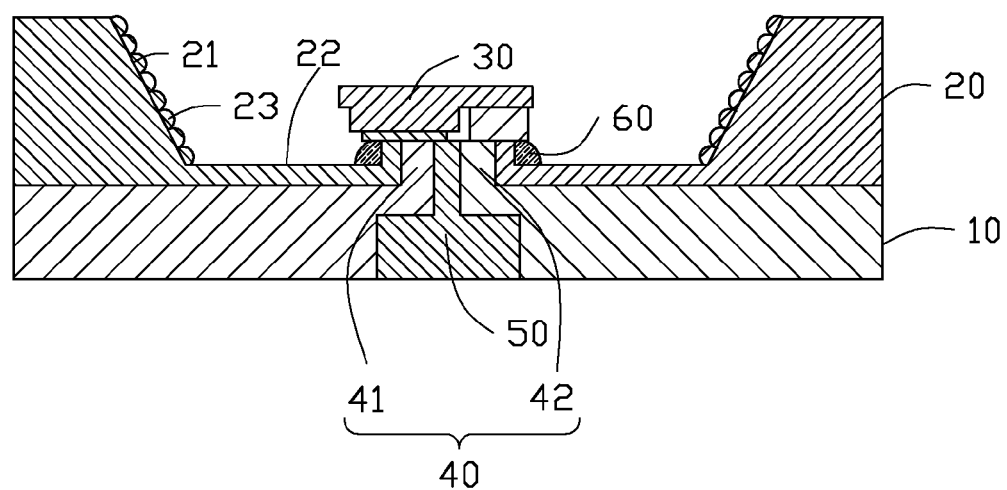
FIG. 3 is a cross sectional view of a flip chip light emitting diode packaging structure of a second embodiment of the present disclosure.

Referring to FIG. 3, a flip chip light emitting diode packaging structure of a second embodiment is similar to that of the first embodiment. In addition, a plurality of protruding portions 23 is formed on the inner surface 21 of the reflecting cup 20. A diameter of the protruding portions 23 is equal, and the protruding portions 23 are arranged evenly. The protruding portions reflect the light from the LED chip 30.

Figure 4:
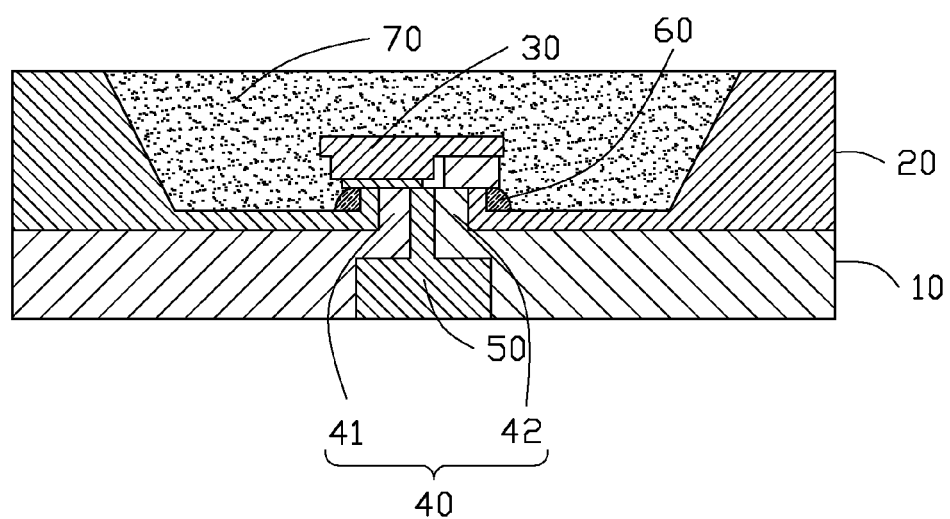
FIG. 4 is a cross sectional view of a flip chip light emitting diode packaging structure of a third embodiment of the present disclosure.

Referring to FIG. 4, a flip chip light emitting diode packaging structure of a third embodiment is similar to that of the first embodiment. However, a encapsulation layer 70 is filled in the reflecting cup 20. The encapsulation layer 70 may includes phosphors and covers the LED chip 30 therein to avoid the LED chip 30 from dust and water vapor.

The embodiments shown and described above are only examples. Many details are often found in the art such as the other features of a flip chip light emitting diode packaging structure. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A flip chip light emitting diode (LED) structure comprising:
a substructure having a first side and a second side opposite the first side, with a protruding platform extending out from the first substrate side; and a light emitting diode supported by, and coupled to, the protruding platform, the light emitting diode having a P electrode and an N electrode;
wherein, the protruding platform has a top surface with a first edge and a second edge opposite the first edge, a first connecting portion along the first edge, a second connecting portion along the second edge and an insulating portion electrically insulating the first connecting portion from the second connecting portion;
wherein, the P electrode rests on a portion of the top protruding platform surface with a portion of the P electrode extending away from the first top surface edge and the P electrode is electrically connected to the first connection portion; and
wherein, the N electrode rests on a portion of the top protruding platform surface with a portion of the N electrode extending away from the second top surface edge and the N electrode is electrically connected to the second connection portion.

2. The flip chip LED packaging structure of claim 1, wherein an insulation portion is extends through the substrate, the insulation portion extends from a bottom end of the substrate to a top end of the protruding platform.

3. The flip chip LED packaging structure of claim 2, wherein the insulation portion divides the substrate to be a first substrate and a second substrate.

4. The flip chip LED packaging structure of claim 2, wherein the insulation portion divides the protruding platform to be a first connecting portion and a second connecting portion.

5. The flip chip LED packaging structure of claim 2, wherein the insulation portion includes a main portion and an extending portion extending from a top end of the main portion to the top end of the protruding platform.

6. The flip chip LED packaging structure of claim 5, wherein a width of the main portion is more than that of the extending portion.

7. The flip chip LED packaging structure of claim 1, wherein a reflecting cup is located on the substrate, and the reflecting cup includes an inner surface and a bottom surface, the inner surface and the bottom surface cooperatively define a receiving chamber therebetween to receive the LED chip therein.

8. The flip chip LED packaging structure of claim 7, wherein a protruding ring is formed on a central portion of the bottom surface to surround the protruding platform.

9. The flip chip LED packaging structure of claim 8, wherein a top surface of the protruding ring and a top surface of the protruding platform are coplanar.

10. The flip chip LED packaging structure of claim 7, wherein a plurality of protruding portions is formed on the inner surface to reflect the light from the LED chip.

11. The flip chip LED packaging structure of claim 10, wherein the protruding portions are arranged evenly, and a diameter of the protruding portions is equal.

12. The flip chip LED packaging structure of claim 7, wherein a encapsulation layer is filled in the reflecting cup, the encapsulation layer includes phosphors and covers the LED chip therein.

13. A flip chip light emitting diode (LED) structure comprising:
a substrate having a first side and a second side opposite the first side, with a protruding platform extending out from the first substrate side;
a light emitting diode;
a P electrode; and
an N electrode;

wherein, the protruding platform has a top surface with a first edge and a second edge opposite the first edge, a first connecting portion along the first edge, a second connecting portion along the second edge and an insulating portion electrically insulating the first connecting portion from the second connecting portion;

wherein, the P electrode rests on a portion of the top platform surface with a portion of the P electrode extending away from the first top surface edge and the P electrode is electrically connected to the first connection portion;

wherein, the N electrode rests on a portion of the top platform surface with a portion of the N electrode extending away from the second top surface edge and the N electrode is electrically connected to the second connection portion; and wherein, the light emitting diode is electrically connected to the N electrode and electrically connected to the P electrode.

14. The flip chip LED packaging structure of claim 13, wherein the insulation portion includes a main portion and a extending portion extending from a top end of the main portion to the top end of the protruding platform.

15. The flip chip LED packaging structure of claim 14, wherein a width of the main portion is more than that of the extending portion.

* * * * *